United States Patent [19]

Doering et al.

[11] Patent Number: 4,677,739

[45] Date of Patent: Jul. 7, 1987

[54] HIGH DENSITY CMOS INTEGRATED CIRCUIT MANUFACTURING PROCESS

[75] Inventors: Robert R. Doering, Plano; Michael P. Duane; Gregory J. Armstrong, both of Houston, all of Tex.

[73] Assignee: Texas Instruments Incorporated, Dallas, Tex.

[21] Appl. No.: 676,351

[22] Filed: Nov. 29, 1984

[51] Int. Cl.[4] ............... H01L 21/265; H01L 29/78; H01L 27/04
[52] U.S. Cl. ........................ 29/576 B; 29/571; 29/578; 148/1.5; 148/187; 148/DIG. 82; 148/DIG. 140; 357/42; 357/91
[58] Field of Search ............ 29/571, 576 B, 578; 148/1.5, 187; 357/42, 91

[56] References Cited

U.S. PATENT DOCUMENTS

| | | | |
|---|---|---|---|
| 4,434,543 | 3/1984 | Schwabe et al. | 29/576 B |
| 4,435,896 | 3/1984 | Parrillo et al. | 29/571 |
| 4,442,591 | 4/1984 | Haken | 29/571 |
| 4,463,491 | 8/1984 | Goldman et al. | 29/571 |
| 4,466,171 | 8/1984 | Jochems | 29/578 |
| 4,481,705 | 11/1984 | Haskell | 29/571 |
| 4,486,943 | 12/1984 | Ryden et al. | 29/571 |
| 4,505,027 | 3/1985 | Schwabe et al. | 29/577 C |
| 4,554,726 | 11/1985 | Hillenius et al. | 29/571 |
| 4,555,842 | 12/1985 | Levinstein et al. | 29/571 |
| 4,561,170 | 12/1985 | Doering et al. | 29/571 |
| 4,561,172 | 12/1985 | Slawinski et al. | 29/576 W |
| 4,569,120 | 2/1986 | Stacy et al. | 29/574 |

Primary Examiner—Upendra Roy
Attorney, Agent, or Firm—John G. Graham

[57] ABSTRACT

A semiconductor device such as a dynamic read/write memory or the like is made by a twin-well CMOS process that employs a minimum number of photomasks. Field oxide isolation areas are formed in nitride-framed recesses so a relatively plane surface is provided, and a minimum of encroachment occurs. Both P-channel and N-channel transistors are constructed with silicided, ion-implanted, source/drain regions, self-aligned to the gates, employing an implant after sidewall oxide is in place, providing lightly-doped drains. The threshold voltages of the P-channel and N-channel transistors are established by the tank implants rather than by separate ion-implant steps for threshold adjust.

9 Claims, 13 Drawing Figures

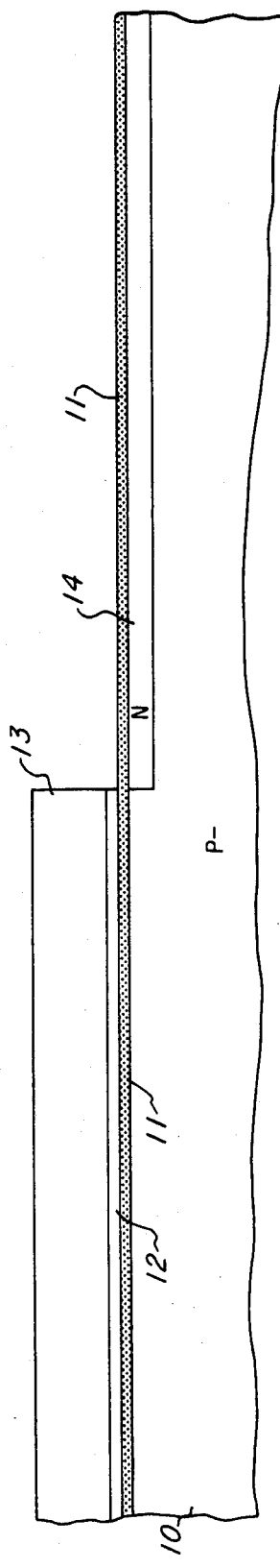
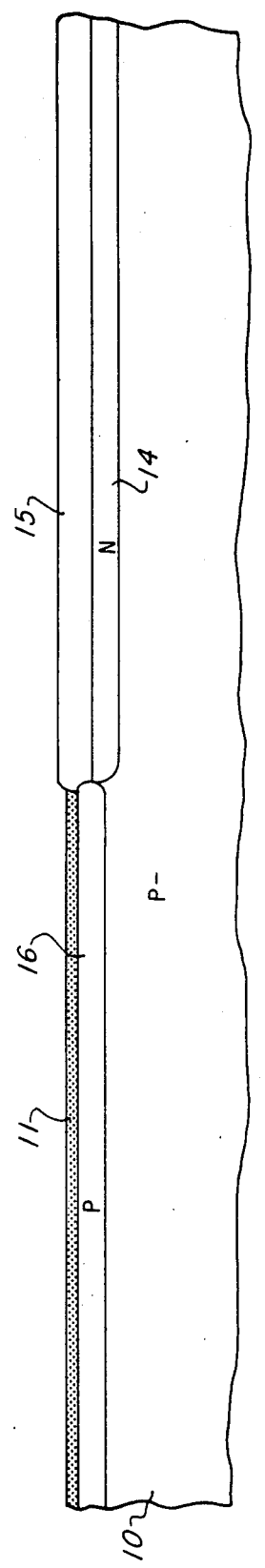

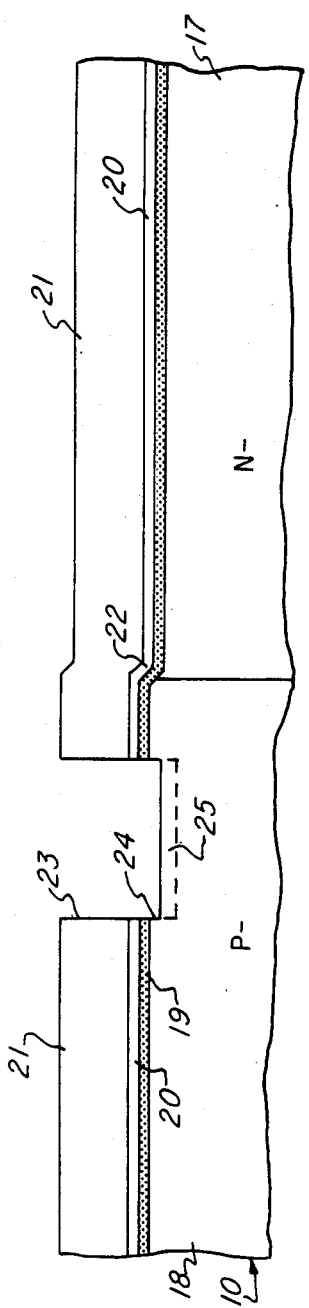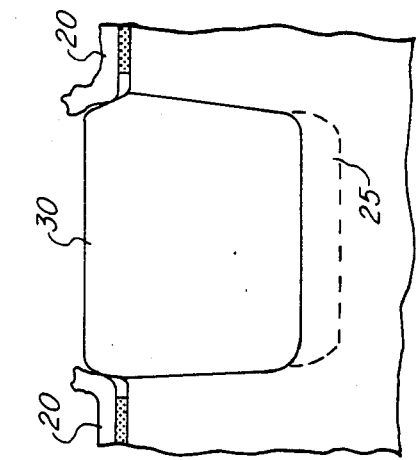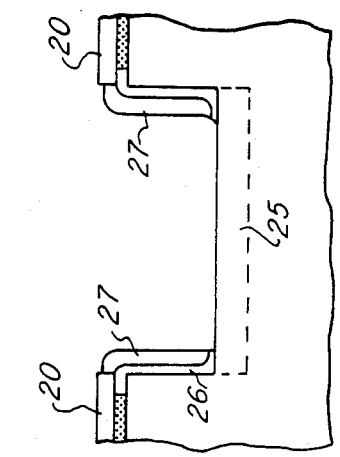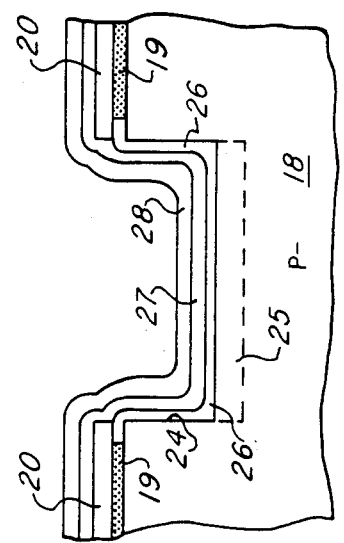

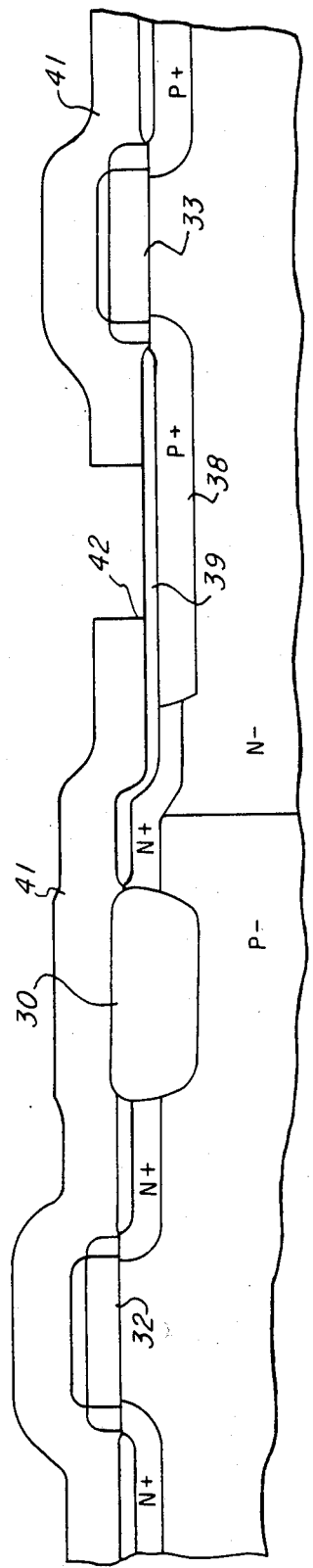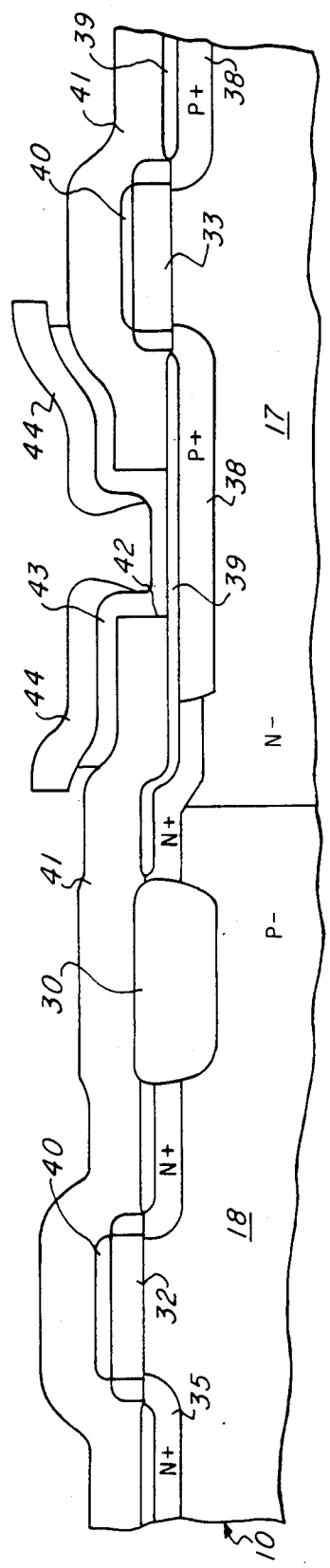
Fig. 12
Fig. 13

HIGH DENSITY CMOS INTEGRATED CIRCUIT MANUFACTURING PROCESS

BACKGROUND OF THE INVENTION

This invention relates to semiconductor devices, and more particularly to methods of making CMOS circuits of the type used in VLSI dynamic memory devices or the like.

Dynamic read/write memory devices of the type shown in U.S. Pat. No. 4,239,993, issued to McAlexander, White and Rao, assigned to Texas Instruments, have been manufactured by N-channel, self-aligned, silicon gate processes as disclosed in U.S. Pat. No. 4,055,444 or U.S. Pat. No. 4,240,092, for example. Requirements for low power have led to more widespread use of CMOS processing as in U.S. Pat. No. 4,295,897, for example, and further the higher densities in 256K-bit or 1-Megabit dynamic RAMs have necessitated the use of smaller device geometries, presenting problems of alignment, step coverage, undercutting, etc. A twin-well CMOS process employing field-plate isolation, and buried N+ source/drain regions and bit lines, suitable for 1-Mbit sized memory arrays, is illustrated in copending application Ser. No. 626,572 filed July 2, 1984, by Doering and Armstrong, assigned to Texas Instruments.

It is the principal object of this invention to provide improved and simplified methods of making integrated circuits for semiconductor memory devices or the like, particularly low-power, high-density devices. Another object is to provide improved CMOS processes as may be used for making high density dynamic RAMs.

SUMMARY OF THE INVENTION

In accordance with one embodiment of the invention, a semiconductor device such as a dynamic read/write memory or the like is made by a twin-well CMOS process that employs a minimum number of photomasks. Field oxide isolation areas are formed in nitride-framed recesses so a relatively plane surface is provided, and a minimum of encroachment occurs. Both P-channel and N-channel transistors are constructed with silicided, ion-implanted, source/drain regions, self-aligned to the gates, employing an implant after sidewall oxide is in place, providing lightly-doped drains. The threshold voltages of the P-channel and N-channel transistors are established by the tank implants rather than by separate ion-implant steps for threshold adjust.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 1-13 are greatly enlarged elevation views in section of a very small portion of a semiconductor chip showing two transistors in a semiconductor device such as a dynamic memory or the like, inluding an N-channel and a P-channel transistor, made by the improved process according to the invention, at successive stages in the manufacturing process;

FIGS. 5, 6 and 7 are enlarged views of a part of remaining figures.

DETAILED DESCRIPTION OF SPECIFIC EMBODIMENT

Figure 3:
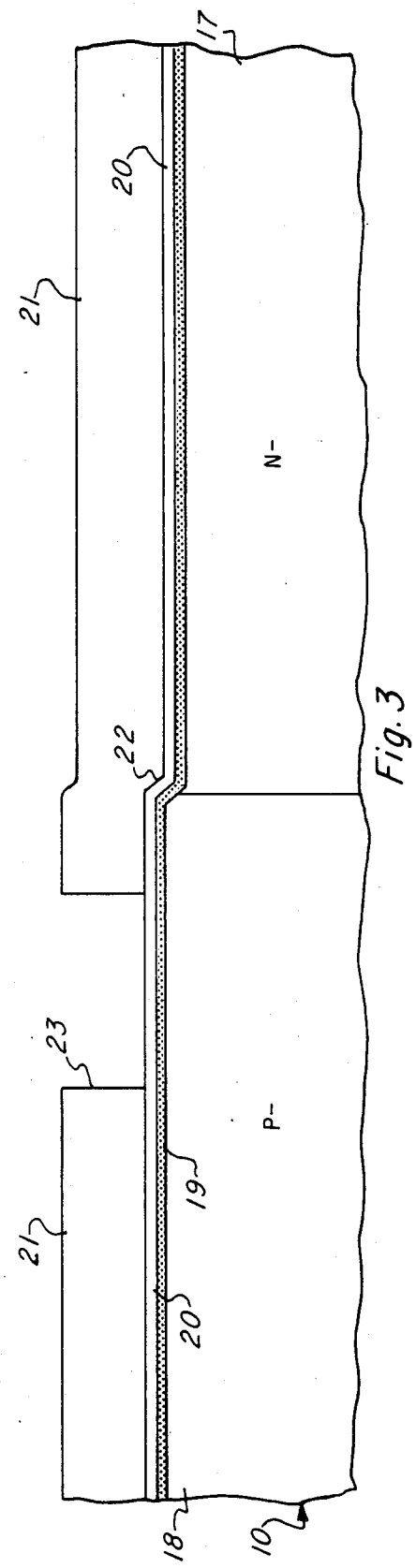

A process for making a CMOS integraged circuit device according to the invention will first be explained, step-by-step, with reference to FIGS. 1-13. The starting point is a slice of semiconductor-grade single crystal silicon of perhaps 4 to 6 inches in diameter and 15-20 mils thick, doped lightly P type. The slice may be P− epitaxial on a P+ substrate. The figures show only a very small portion of the slice, perhaps ten or twelve microns wide, enough to illustrate the formation of two representative transistors, one N-channel and one P-channel. It is understood that many millions or even hundreds of millions of such transistors would be formed simultaneously on the slice, depending upon the function of the devices being manufactured.

Referring to FIG. 1, after cleaning the silicon slice including the substrate portion 10, a thin coating 11 of silicon dioxide is thermally grown to a thickness of about 350Å at 850° to 900° C. in steam. A coating 12 of silicon nitride is deposited over the surface to a thickness of about 1000Å using a low pressure chemical vapor deposition method. The first photomask is now employed to pattern a layer 13 of photoresist defining what will be the N tanks. The nitride layer 12 is etched using the photoresist 13 as a mask, then the photoresist and nitrdie is used as a mask to implant N type impurity into region 14, from which the tank is to be formed. The N implant uses phosphorous at a dosage of about $3 \times 10 \exp 12$ per sq.cm. at 150 Kev. After the implant, the photoresist 13 is stripped off and the slice cleaned, leaving the silicon nitride mask in place.

Turning now to FIG. 2, a layer 15 of silicon oxide is thermally grown to a thickness of about 3000Å in steam at about 850° to 900° C., using the nitride 12 as a mask. The phosphorous in the implanted region 14 diffuses further into the silicon face ahead of the oxidation front, but not to its final depth. The nitride layer 12 is removed by etching after the oxide 15 has been grown, then a P type implant is performed using the oxide 15 as a mask, to create a region 16 that will become the P tank for the N-channel transistors. This implant uses boron as the impurity, at a dosage of about $5.5 \times 10 \exp 12$ per cm.sq. at 50 Kev.

The next step is a high temperature treatment to drive in the tank regions. The slice is heated to about 1100°–1150° C. for several hours in an inert atmosphere to produce tank regions 17 and 18, seen in FIG. 3, from the implanted regions 14 and 16. The tank regions are about 3 microns in depth; to maintain the scale the lower parts are not seen in the drawings.

Referring to FIG. 3, after the tank drive-in, all of the oxide 11 and 15 is removed and the surface cleaned, then a new thin coating 19 of thermal oxide is grown, like the original coating 11. Another layer 20 of silicon nitride is deposited, like the original layer 12, to a thickness of about 1400Å. At this point the second photoresist mask is used to pattern the nitride layer 20. A coating 21 of photoresist is applied and exposed to light through a mask (aligned using the edge 22 of the N tank) which creates what will be recessed, thick-oxide isolation areas. A hole 23 is left where the thick oxide is to be grown.

Referring to FIG. 4, the nitride 20 and oxide 19 are etched within the hole 23 using plasma etch, and then the silicon is etched to a depth of about 1000Å into the substrate using an anisotropic etch method to produce a recess 24 in the face of the slice at every area where an isolating field oxide is to be created. Usually the areas would surround each transistor or group of related transistors of a gate circuit or the like. The width needed to isolation is only about one micron. A boron implant is performed to create channel stops beneath the field oxide, using a dosage of about $4 \times 10\text{exp}12$ per sq.cm. at 100 Kev; this leaves a P+ region 25 below the recess.

Referring to the enlarged view of the isolation area, FIG. 5, the photoresist coating 21 is stripped, then the slice is subjected to a short etch to undercut the oxide layer 19, i.e., remove a slight amount of this oxide beneath the edges of the nitride 20 around the walls of the recess 24. Another coating of oxide 26 is grown to cover the bottom and sidewalls of the recess 24; this oxide is grown to a thickness of about 250Å at about 850°-900° C. in steam. A layer 27 of silicon nitride is deposited to a thickness of about 400Å, over the oxide 26. Then, a thicker layer 28 of silicon oxide is deposited to about 2000Å using an isotropic, plasma-enhanced CVD process to cover the sidewalls to frame the field oxide areas. Turning now to FIG. 6, an anisotropic etch is used to remove the oxide 28 and nitride 27 at all flat areas but to leave the sidewalls. Sidewall filaments of the oxide 28 are then removed by etching, leaving the frame of nitride 27 to protect the sidewalls of the recess 24 during field oxide growth. This method of creating fully-framed, fully-recessed oxide isolation areas is similar to that disclosed by Pollack et al in applications Ser. Nos. 620,995 and 621,019, and by Slawinski & Doering in Ser. No. 621,023, all filed Aug. 27, 1984 and all assigned to Texas Instruments.

Referring to FIG. 7, field oxide 30 is grown to fill the recess 24, producing a relatively flat surface. The final thickness of the field oxide is about 7000Å, but mostly recessed into the face of the silicon rather than build-up above the original surface. A temperature of about 850° to 900° C. is used, in a steam ambient for several hours. The nitride coating 20 prevents oxide growth on the original surface, and the sidewall nitride 27 retards thermal oxide growth on the sidewalls to avoid moat encroachment and birds-beak effect. After the field oxide 30 is grown, the nitride 20 and 27 is removed by etching, then the oxide 19 is also removed and the slice cleaned.

Figure 8:
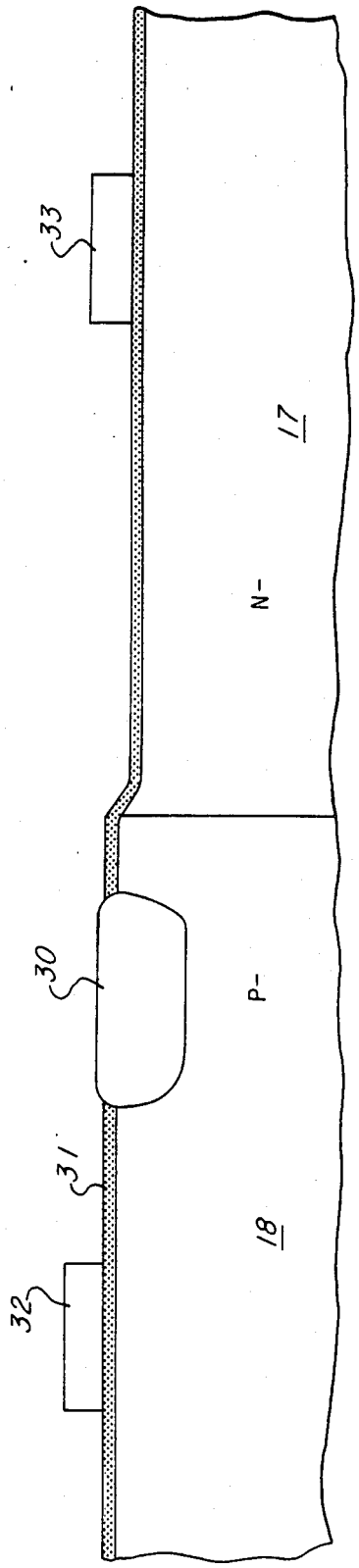

Turning now to FIG. 8, the next step in the process is growing gate oxide 31 to a thickness of about 200Å by thermal oxidation. A layer of polycrystalline silicon is deposited over the gate oxide to cover the entire face of the slice to a thickness of about 4500Å, then doped with phosphorous to render it highly conductive. The polycrystalline silicon is patterned using photoresist and the third mask, etching to leave gates 32 and 33 for the N-channel and P-channel transistors, as well as various interconnects where the poly extends over field oxide. The photoresist is removed after the gate etch.

Figure 9:
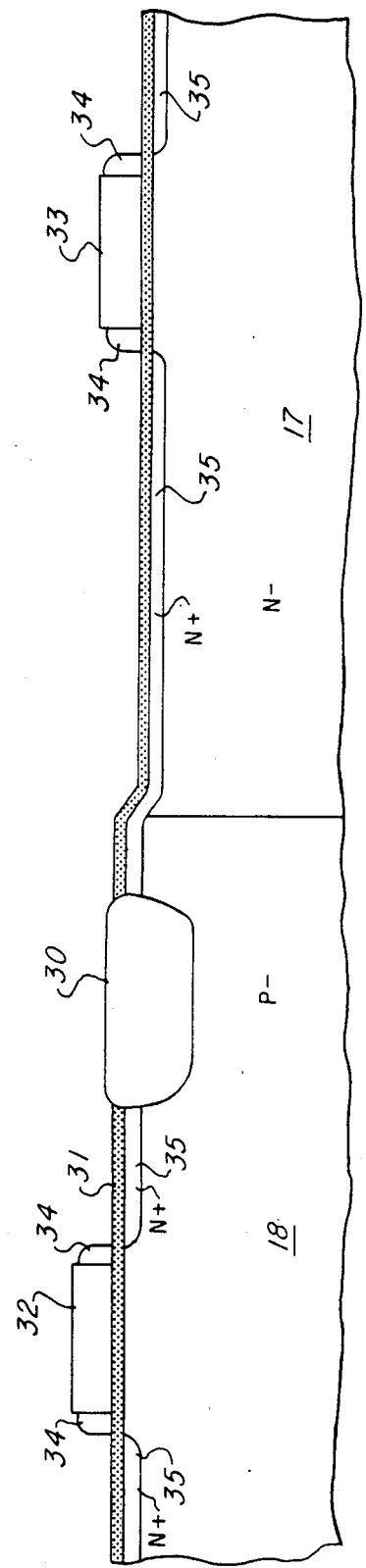

A coating of silicon oxide is deposited over the face of the slice to a thickness of about 2500Å, then etched using an anisotropic process to leave sidewall oxide 34 as seen in FIG. 9, for each gate 32 or 33. An N-type source/drain implant is performed using the poly gates 32, 33 with sidewalls 34 as masking, to produce N+ source/drain regions 35. A phosphorous ion implant of a dosage of about $4 \times 10\text{exp}14$ per cm.sq. at about 100 Kev is used. The N well is not masked, so the N+ region 35 extends into the areas where P-channel transistors will be created, but there will be over-doped by the P+ source/drain implant.

Figure 10:
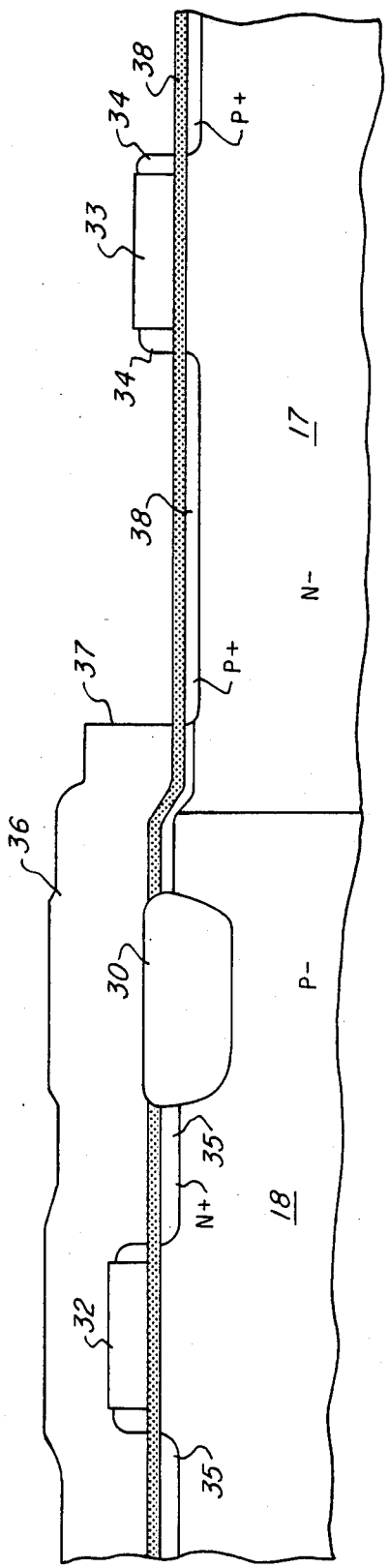

As illustrated in FIG. 10, the fourth mask is used to expose a photoresist coating 36 to open holes 37 where P-channel transistors are to be created. A P+ implant using boron at a dosage of about $5 \times 10\text{exp}15$ per cm.sq. at about 40 Kev produces P+ source/drain regions 38 which are at higher concentration than the N+ regions 35. The N-channel transistors are masked by the photoresist 36. After the P+ implant, the resist is removed, then an anneal at about 900° C. in an inert atmosphere for about 90 minutes activates the implanted impurities and drives the source/drain diffusions 35 and 38 slightly under the gates 32 and 33.

Figure 11:
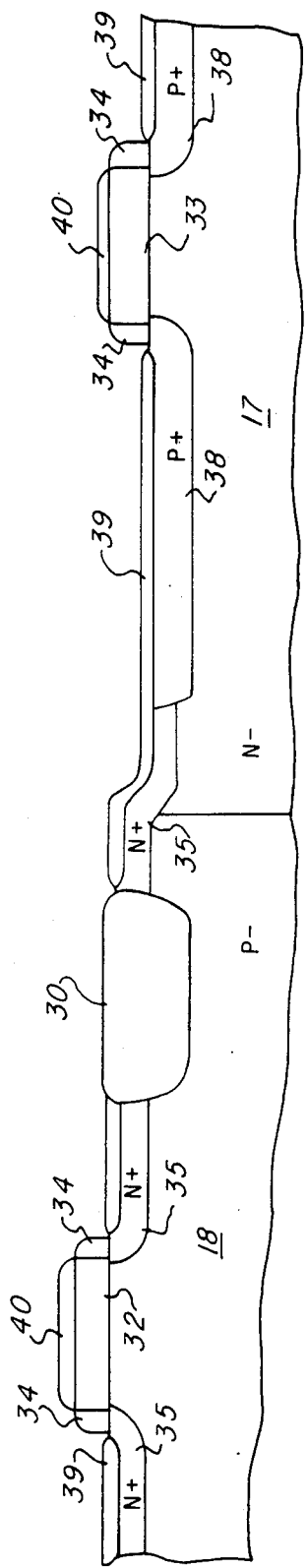

Referring to FIG. 11, the next step is forming silicided source/drain surfaces. After cleaning the face, a coating of titanium is deposited to a thickness of about 1000Å, using a sputtering process. The slice is heated to about 675° C. in argon and forming gas to direct-react titanium and silicon to create a titanium silicide coating 39 over the source/drain regions 35 and 38, and also a titanium silicide coating 40 over the polycrystalline silicon gates 32 and 33. The unreacted titanium or unwanted titanium compounds are stripped using an etchant, then the silicide 39 and 40 is annealed at about 800° C. in argon.

Turning now to FIG. 12, a layer 41 of silicon oxide is deposited to a thickness of about 5000Å over the entire face of the slice to form a multilevel insulator, i.e., to insulate the metal conductor level from the titanium silicide levels. The fifth mask is used to pattern this multilevel oxide 41, employing photoresist as usual, to leave a contact hole 42 where a metal-to-silicon contact is to be made. The oxide 41 is etched using a plasma etch process that leaves vertical sidewalls. No reflow or other technique is employed to smooth the multilevel oxide at the holes 42. A layer 43 of tungsten is deposited by a sputtering or CVD method that provides good sidewall or step coverage, to a thickness of about 3000Å, then a layer 44 of aluminum is deposited over the tungsten, to a thickness of about 4000Å. The sidewall or step coverage of the aluminum layer 44 is poor, but the tungsten 43 provides a conductive path into the hole to engage the titanium silicide 39. The sixth photomask step is now used to pattern the metal. Using photoresist as a mask, the desired pattern of metal contacts and interconnects is defined; the aluminum is etched first, then a different etch used for the tungsten, then an overetch to remove filaments of tungsten. The photoresist is stripped, and the device is annealed in hydrogen at about 450° C. Although not shown, the final steps in the process include deposition of a protective nitride coating of about 10,000Å thickness over the face of the slice, followed by patterning using the seventh photomask step to expose bonding pads. Fabrication is completed by grinding the backside of the slice, depositing gold on the backside, scribing and breaking the slice into individual bars (each containing a 1-Mbit DRAM, for example), and mounting the bars in I/C packages.

Important features and advantages of this CMOS process include the following:

Only seven photomask steps are used, although the process is compatible with additional optional levels which may be interposed, such as, for example, trench capacitors, a grounded field-plate layer (usually polysilicon), poly-to-silicon contacts, and the like.

The threshold voltages of the N and P channel transistors are determined by the tank implants, rather than requiring additional masked implants to set these thresholds. The tank impurity concentrations are relatively insensitive to subsequent processing.

Devices with one-micron geometry for the width of the field oxide 30, the gates 32, 33, the contact hole 43, and the width of metal lines, may be fabricated with this process because of the lack of encroachment, excellent sidewall coverage, etc.

The source/drain regions for both N and P-channel transistors, as well as the gates 32, 33, are clad with silicide, so that the sheet resistance is low, below one ohm/square.

The two-level tungsten and aluminum contact allows a contact resistance of about one ohm for a one-micron contact hole to the silicon or to the polysilicon.

The counter-doped, graded drains provided by the sidewall oxide used on the transistor gates results in hot-carrier suppression, as well as minimum gate/drain overlap, and yet is achieved with a simplified process.

The low-temperature and no-reflow process for the metal contacts and interconnects reduces the risk of metal corrosion and maintains the low intrinsic resistance of the titanium silicide. No heavily-doped phosphosilicate glass is needed for the multi-level oxide.

The aluminum-tungsten metallization provides electomigration resistance as well as corrosion resistance.

The phosphorous concentration in the regions 35 is about a factor of ten less than the boron concentration in the regions 38, allowing counter doping by the masked boton for the P+ regions and further suppresses hot-carrier effects for the N-channel devices (which are inherently more susceptible to hot-carrier problems.

With the titanium silicide cladding process, there is no penalty in sheet resistance of the source/drain regions 35 and 38 which would usually be associated with a lightly-doped phosphorous drain. It has also been discovered that there is no significant increase in "resistance" at the silicide-to-silicon interface with the lightly-doped phosphorous drain.

CONCLUSION

The basic CMOS process flow described above uses only seven masks, and is designed to be a "modular" in the sense that additional levels can be inserted (for particular product needs) with minimal impact on the device parameters (e.g., computer models of transistors) created by the basic process flow. For example, an experimental DRAM adds buried N+ bit lines and a field plate as in application Ser. No. 626,572, and trench capacitors similar to that of Ser. No. 627,371, filed July 3, 1984. Buried contacts could be implemented in the same manner. Other devices may require the addition of a second level of metal, which may use a compatible process. The modularity of the process flow is largely the result of setting Vtn and Vtp with the tank doping only (no separate Vt implants are required). Once the tank surface doping concentrations have been determined by the tank implants and the tank drive, they are essentially unaffected by the subsequent processing. The tank doping profiles are much deeper and more uniform than typical Vt-adjusted channel doping, having reached equilibrium with the oxidized surface at the relatively high temperature of 1100°–1150° C. for several hours during the isolation oxide growth. Thus, subsequent oxidations, deglazes, and anneals at temperatures less than about 1000° C., even for many hours, have little affect on device parameters such as transistor Vt or diode capacitance. Note that the tanks are created by a twin-well process. The exact tank-implant doses depend on the doping of the starting material. For the doses listed, it is assumed that the epitaxial layer contains boron at a concentration of about 10exp15 per cm.sq. (about 13 ohm-cm). The epitaxial layer should be about 10 μm thick to allow for diffusion from the heavily-doped substrate.

The source/drain implants for regions 35 and 38 are performed after sidewall-oxide filaments 34 are created. the subsequent source/drain anneal drives the resulting junctions slightly under the edges of the gates 21 and 33. This structure provides minimum gate/drain-overlap capacitance, effective channel length almost as long as gate length, and hot-carrier suppression (drain diffusions are both graded and less-overlapped by the gate). Further hot-carrier suppression for n-channel devices results from the use of relatively light phosphorous source/drain regions 35. The light phosphorous is easily counter-doped with a standard boron dose in the p-channel regions 38. Note that the boron diffuses deeper than the phosphorous during the source/drain anneal. Thus, only one source/drain implant mask is required. This relatively simple CMOS source/drain technique is made practical by the moat cladding, which gives low sheet resistance despite the light phosphorous doping. Forward-bias diode characteristics show that the series resistance is larger for the p+ than the n+ diodes, again, despite the light phosphorous doping.

The contact process contains no phosphosilicate glass reflow, etch-back planarization, wet-dry etch, or other topography-smoothing complications. The contact holes 42 are anisotropically etched through undoped oxide 41. An overetch of about 60% (relative to large open areas like the scibe line) is used to compensate for the effectively lower oxide etch rate in the 1-micron contact holes 42. Even though the oxide etch is quite selective to the titanium silicide cladding 39 and 40 on moat and gate, it is better to define all contacts the same size to minimize the possibility of overetch in critical areas. With no heavily-doped interlevel oxide, the risk of metal corrosion due to $H_3PO_4$ formation (from PSG+moisture) is greatly reduced. This is, of course, especially significant for parts packaged in plastic. The usual CMOS problem of avoiding counter-doping the p+ source/drain in contacts exposed to PSG reflow, is also solved by this approach. Furthermore, eliminating the relatively high-temperature reflow allows the sheet resistances of titanium silicide clad source/drain and gate to remain at their minimum values as set by the 800 C anneal.

The advantages associated with the previously-discussed contact process are all made possible by the use of tungsten as the bottom layer of the metallization. Even sputtered tungsten provides adequate step coverage, and CVD tungsten may be preferable as a substitute for the sputtered tungsten, to obtain even better step coverage—perhaps completely filling the 1-micron contact holes. In either case, the tungsten needs to be clad with a material suitable for wire bonding, such as aluminum. Aluminum also serves to lower the overall sheet resistance of the metal stack. Standard Si-doped aluminum is used on top of the tungsten, but Ti-doped aluminum may be a better choice for electromigration resistance. Other reasons for choosing tungsten for the bottom layer include its excellent resistance to both electromigration and corrosion. Al(Ti) and tungsten also form a compatible combination from the standpoint of tungsten providing a good diffusion barrier. In addition, tungsten is an excellent etch-stop for the aluminum etch. As much as 300% over-etch (anisotropic) may be used to clear aluminum filaments before proceeding with the tungsten etch (which can be performed in the same reactor). The tungsten etch is likewise quite selective to oxide, which permits clearing tungsten filaments over double-level poly topography with anisotropic etching.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a CMOS twin-well semiconductor device, comprising the steps of:
    implanting N impurity into a selected area of a face of a P type silicon body creating an N well area and growing a first oxide over said N well area.
    implanting P impurity into said face using said first oxide as a mask to create a P well area, and subjecting said body to heat treatment to drive both said N well and P well into said face,
    forming an oxidation mask over said face and opening a hole in said mask within said P well area, then etching a recess into the silicon of said face in said hole,
    oxidizing said silicon in said recess to create a field oxide isolation area extending into said face, the field oxide having a top surface about level with said face,
    applying a layer of conductive material on said face and patterning said layer to leave gates for transistors on said N well and P well areas,
    implanting N+ impurity into both the N well and P well areas to create N+ source/drain for an N channel transistor in the P well area, using said gates as a mask,
    implanting P+ impurity into only the N well area, using the gates and a photoresist coating as a mask, to create P+ source/drain regions in the N well area, at a concentration much higher than that in said N+ source/drain regions,
    including the step of forming sidewall spacers on said gate layers prior to said steps of implanting,
    and including the step of forming direct-reacted silicide on said source/drain regions,
    said step of forming direct-reacted silicide being masked by said sidewall spacers on said gates.

2. A method according to claim 1 including the step of forming a channel stop region in the bottom of said recess prior to forming said field oxide.

3. A method according to claim 1 wherein said gate layers are polycrystalline silicon, and including the step of forming direct-reacted silicide on top of said gate layers.

4. A method according to claim 1 wherein said step of oxidizing said silicon in said recess includes forming an oxidation mask selectively on the sidewalls of said recess.

5. A method of making a semiconductor device, comprising the steps of:
    implanting impurity of one type into a selected area of a face of a semiconductor body of the opposite type creating a first well area and growing a first oxide over said first well area,
    implanting impurity of the opposite type into said face using said first oxide as a mask to create a second well area, and subjecting said body to heat treatment to drive both said first well and second well into said face and to establish threshold voltages for transistors subsequently formed in said first and second areas.
    forming an oxidation mask over said face and opening a hole in said mask within said second well area, then etching a recess into said face in said hole,
    oxidizing said semiconductor material of said face in said recess to create a field oxide isolation area extending into said face, the field oxide having a top surface about level with said face,
    applying a layer of conductive material on said face and patterning said layer to leave gates for transistors on said first well and second well areas,
    implanting impurity of said one type into both the first well and second well areas to create source/drain regions for a transistor in the second well area, using said gates as a mask,
    implanting impurity of said opposite type into only the first well area, to create source/drain regions for a transistor in the first well area, at a concentration much higher than that of said source/drain regions in the second well area.
    including the step of forming sidewall spacers on said gates prior to said steps of implanting,
    and including the step of forming direct-reacted silicide on said source/drain regions,
    wherein said step of forming direct-reacted silicide is masked by said sidewall spacers on said gates.

6. A method according to claim 5 including the step of forming a channel stop region in the bottom of said recess prior to forming said field oxide.

7. A method according to claim 5 wherein said gate layers are polycrystalline silicon, and including the step of forming direct-reacted silicide on top of said gate layers.

8. A method according to claim 5 wherein said step of oxidizing said semiconductor material in said recess includes forming an oxidation mask selectively on the sidewalls of said recess.

9. A method according to claim 7 wherein said body is silicon, said impurity of one type is P type, said impurity of opposite type is N type, said transistor in the first well area is P-channel and has a threshold voltage of 1.2 v, said transistor in the second well area is N-channel and has a threshold voltage of 0.8 v, when a supply voltage of +5 v is used for the device and a substrate bias of −3 v is imposed.

* * * * *